(12) United States Patent
Xu

(10) Patent No.: US 6,710,416 B1
(45) Date of Patent: Mar. 23, 2004

(54) SPLIT-GATE METAL-OXIDE-SEMICONDUCTOR DEVICE

(75) Inventor: Shuming Xu, Schnecksville, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/439,863

(22) Filed: May 16, 2003

(51) Int. Cl.$^7$ .................. H01L 31/119; H01L 29/76
(52) U.S. Cl. ............. 257/409; 257/412; 257/408; 257/335; 257/336; 257/493
(58) Field of Search .............. 257/409, 412, 257/408, 401, 335, 336, 492, 493

(56) References Cited

U.S. PATENT DOCUMENTS

| | | | | |
|---|---|---|---|---|
| 5,179,032 A | * | 1/1993 | Quigg ............ | 438/268 |
| 5,918,137 A | | 6/1999 | Ng et al. ........ | 257/294 |
| 6,087,697 A | * | 7/2000 | Patel ............. | 257/329 |
| 6,461,902 B1 | | 10/2002 | Xu et al. ........ | 438/163 |
| 2002/0017682 A1 | * | 2/2002 | Xu et al. ........ | 257/328 |

* cited by examiner

Primary Examiner—Minhloan Tran
(74) Attorney, Agent, or Firm—Ryan, Mason & Lewis, LLP

(57) ABSTRACT

A metal-oxide-semiconductor (MOS) device is formed comprising a semiconductor layer of a first conductivity type, a first source/drain region of a second conductivity type formed in the semiconductor layer, and a second source/drain region of the second conductivity type formed in the semiconductor layer and spaced apart from the first source/drain region. The MOS device further comprises a first gate formed proximate an upper surface of the semiconductor layer and at least partially between the first and second source/drain regions, the first gate comprising a plurality of sections spaced apart from one another, and a second gate formed proximate the upper surface of the semiconductor layer, the second gate comprising a first end formed between at least two of the plurality of sections of the first gate and a second end opposite the first end formed above at least a portion of the first gate, the second end being wider than the first end, the first and second gates being electrically isolated from one another.

22 Claims, 4 Drawing Sheets

SPLIT-GATE METAL-OXIDE-SEMICONDUCTOR DEVICE

FIELD OF THE INVENTION

The present invention relates generally to metal-oxide-semiconductor (MOS) devices, and more particularly relates to techniques for improving the high-frequency performance of an MOS device.

BACKGROUND OF THE INVENTION

Power MOS devices, including lateral diffused MOS (LDMOS) devices, are employed in a variety of applications, such as, for example, power amplifiers in wireless communications systems. In applications where high-frequency operation is desired, such as in a radio frequency (RF) range (e.g., above 1 gigahertz (GHz)), a conventional LDMOS device generally uses a shorter gate length, in comparison to the gate length of a typical LDMOS device that is not adapted for high frequency applications, in order to improve the RF performance of the device. However, reducing the gate length undesirably increases hot-carrier degradation in the device. Moreover, reducing the gate length also increases the gate resistance ($R_g$) associated with the device. Since the output gain of the MOS device is inversely proportional to the gate resistance of the device, increasing the gate resistance results in a decrease in the output gain of the device, which is particularly undesirable in an amplifier application.

It is well known that the transconductance associated with an MOS device may be increased by proportionally decreasing the thickness of a gate oxide layer in the device. However, using a thinner gate oxide undesirably results in a higher gate-to-source capacitance (Cgs), which may undesirably effect high frequency performance of the device. It would be desirable to reduce the gate oxide thickness in a given MOS device without significantly increasing the gate-to-source capacitance associated with the device.

Hot-carrier degradation (HCD) in an MOS device generally results from heating and subsequent injection of carriers into the gate oxide of the device, which results in a localized and nonuniform buildup of interface states and oxide charges near and underneath a gate of the device. This phenomenon can produce undesirable variations in certain characteristics of the MOS device, including threshold voltage, transconductance, drain current, etc., thus impacting the operation and reliability of the device. It is well known that HCD is a strong function of the internal electric field distributions of the MOS device.

While the lateral electric field near the gate in a drain side of the device is primarily responsible for heating and avalanche, the transverse electric field primarily influences carrier injection into the gate oxide. The reduction of channel length in the MOS device affects the internal electric field distributions, and hence the carrier heating and injection processes. As device geometries shrink, the localized internal electric field distributions can become even higher in the device, thus exacerbating the problem.

Accordingly, it would be advantageous to have an MOS device capable of improved high frequency performance, such as power gain and efficiency, without increasing hot-carrier degradation in the device.

SUMMARY OF THE INVENTION

The present invention provides techniques for improving high frequency performance of an MOS device without significantly impacting the hot-carrier degradation characteristics of the device. Moreover, the techniques of the present invention can be used to fabricate an integrated circuit (IC) device, for example, an LDMOS device, using conventional complementary metal-oxide-semiconductor (CMOS) compatible process technology. Consequently, the cost of manufacturing the IC device is not significantly increased. Furthermore, the techniques of the present invention may be used to form an MOS device which is easily integrated with standard CMOS circuits for achieving improved high frequency and/or high power performance.

In accordance with one aspect of the invention, an MOS device is formed comprising a semiconductor layer of a first conductivity type, a first source/drain region of a second conductivity type formed in the semiconductor layer, and a second source/drain region of the second conductivity type formed in the semiconductor layer and spaced apart from the first source/drain region. The MOS device further comprises a first gate formed proximate an upper surface of the semiconductor layer and at least partially between the first and second source/drain regions, the first gate comprising a plurality of sections spaced apart from one another, and a second gate formed proximate the upper surface of the semiconductor layer, the second gate comprising a first end formed between at least two of the plurality of sections of the first gate and a second end opposite the first end formed above at least a portion of the first gate, the second end being wider than the first end, the first and second gates being electrically isolated from one another. The device may be configured such that a channel is formed between the first and second source/drain regions in response to a first signal in a first frequency range, which may be a direct current (DC) bias voltage applied to the first gate, and to at least partially modulate the channel in response to a second signal in a second frequency range applied to the second gate.

These and other features and advantages of the present invention will become apparent from the following detailed description of illustrative embodiments thereof, which is to be read in connection with the accompanying drawings.

DETAILED DESCRIPTION OF THE PREFERRED EMBODIMENTS

The present invention will be described herein in the context of an illustrative MOS integrated circuit fabrication technology suitable for forming discrete RF LDMOS transistors, as well as other devices and/or circuits. It should be appreciated, however, that the present invention is not limited to the fabrication of this or any particular device or circuit. Rather, the invention is more generally applicable to an MOS device comprising a novel gate structure which advantageously enables the MOS device to provide improved high frequency performance, while achieving high gain and reducing hot-carrier degradation effects. Moreover, although implementations of the present invention are described herein with specific reference to an LDMOS device, it is to be appreciated that the techniques of the present invention are similarly applicable to other devices, such as, but not limited to, a vertical diffused MOS (DMOS) device, an extended drain MOSFET device, etc., with or without modifications thereto, as will be understood by those skilled in the art.

Figure 1:
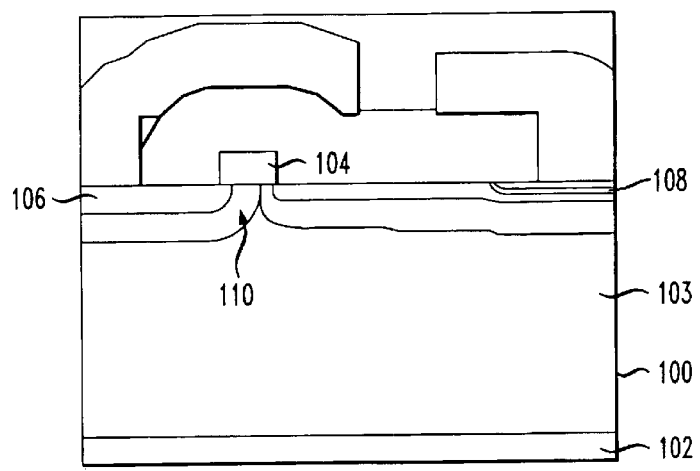
FIG. 1 is a cross-sectional view illustrating at least a portion of a conventional LDMOS device.

FIG. 1 illustrates a cross-sectional view of a portion of a semiconductor wafer 100. The wafer 100 includes a conventional LDMOS device formed on a substrate 102. The LDMOS device includes a source region 106 and a drain region 108 formed in an epitaxial region 103 of the wafer 100. The LDMOS device further includes a gate 104 formed above a channel region 110 of the device. The channel region 110 is at least partially formed between the source and drain regions.

For the LDMOS device to satisfactorily function in a high frequency environment (e.g., above about 1 GHz), the gate-to-source capacitance associated with the device should be minimized. In order to accomplish this, a short gate 104 can be employed. However, as previously stated, using a short gate generally results in increased hot-carrier degradation and increased gate resistance. The hot-carrier degradation may create serious reliability issues, while a high gate resistance may significantly limit the gain of the device. Consequently, the conventional LDMOS device structure is not suitable for use in high-frequency applications.

Figure 2A:
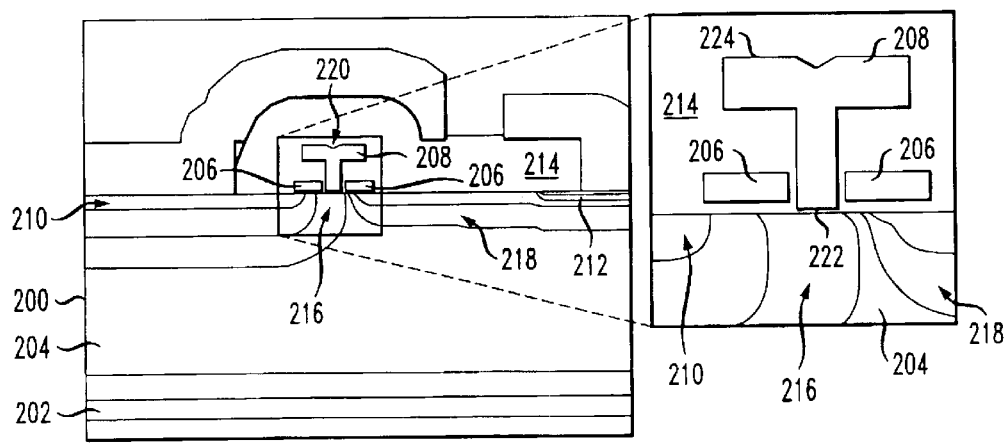
FIG. 2A is a cross-sectional view illustrating at least a portion of an exemplary LDMOS device, formed in accordance with an illustrative embodiment of the present invention.

FIG. 2A illustrates a cross-sectional view of at least a portion of a semiconductor wafer 200 in which the techniques of the present invention may be implemented. It is to be understood that the various layers and/or regions shown in the figure may not be drawn to scale. The wafer 200 includes an exemplary LDMOS device formed on a substrate 202. The substrate 202 is commonly formed of single-crystal silicon, although alternative materials may be used, such as, but not limited to, germanium (Ge), gallium arsenide (GaAs), etc. Additionally, the substrate may have been modified by adding an impurity or dopant, such as by a diffusion or implant step, to change the conductivity of the material (e.g., n-type or p-type). In a preferred embodiment of the invention, the substrate 202 is of p-type conductivity.

The term "semiconductor layer" as used herein refers to any material upon which and/or in which other materials may be formed. The semiconductor layer may comprise a single layer, such as, for example, the substrate 202, or it may comprise multiple layers, such as, for example, the substrate 202 and epitaxial layer 204. The semiconductor wafer 200 comprises the substrate 202, with or without an epitaxial layer 204, and preferably includes one or more other layers formed on the substrate. The term "wafer" is often used interchangeably with the term "silicon body," since silicon is typically employed as the semiconductor material comprising the wafer. It should be appreciated that although the present invention is illustrated herein using a portion of a semiconductor wafer, the term "wafer" may include a multiple-die wafer, a single-die wafer, or any other arrangement of semiconductor material on which a circuit element may be formed.

The exemplary LDMOS device includes a source region 210 and a drain region 212 formed in the epitaxial layer 204 of the wafer 200, such as by a conventional implant and diffusion process. The source and drain regions are preferably doped, such as by a conventional implant step, with an impurity to change the conductivity of the material. Preferably, the source and drain regions 210, 212 have a conductivity type associated therewith which is opposite a conductivity type of the substrate 202, so that active regions can be formed in the device. In a preferred embodiment of the invention, the source and drain regions 210, 212 are of n-type conductivity.

It is to be appreciated that, in the case of a simple MOS device, because the MOS device is symmetrical in nature, and thus bidirectional, the assignment of source and drain designations in the MOS device is essentially arbitrary. Therefore, the source and drain regions may be referred to generally as first and second source/drain regions, respectively.

A channel region 216 and a drift region 218 are formed in the exemplary LDMOS device. The channel region 216 is formed near the source region 210 while the drift region 218 extends from the channel region 216 to the drain region 212. The channel region 216 may be formed of a material having the same conductivity type as the substrate, preferably p-type. The drift region 218 may be formed of material having the same conductivity type as the source and drain regions, preferably n-type, although the relative doping concentration of the drift region compared to the source and drain regions is typically lower.

The exemplary LDMOS device further includes a gate 220 formed above at least a portion of the channel region 216 and proximate an upper surface of the wafer 200. As previously stated, making the gate as short as possible is desired during high frequency operation of the MOS device, at least in part to reduce the gate-to-source capacitance Cgs associated with the device. However, making the gate shorter can have undesirable consequences at DC operation of the device, such as increasing hot-carrier degradation and/or reducing the drain-to-source breakdown voltage in the device. Additionally, a shorter gate has an increased gate resistance associated therewith, thus resulting in a decreased gain of the device.

An important aspect of the present invention is that the gate 220 is formed of a plurality of portions 206 and 208, each of the portions serving a specific function. For example, in accordance with one aspect of the invention, one of the portions 206 is employed during direct current (DC) operation of the device, and may therefore be referred to as a DC gate, and another of the portions 208 is used during high frequency (e.g., RF) operation of the device, and may therefore be referred to as a high frequency gate. The high frequency gate 208 is self-aligned to the channel region 216. By splitting the gate into multiple portions, with each portion being used in a different frequency range, the present invention is able to tailor the respective portions of the gate for its intended frequency range of operation, thereby satisfying the differing gate characteristics required for the corresponding frequency ranges of use.

The plurality of portions 206, 208 comprising the gate 220 are preferably electrically isolated from one another. In addition, the gate 220 is electrically isolated from the source, drain, channel and drift regions by an insulating material 214. The insulating material may comprise an oxide, such as, for example, silicon dioxide ($SiO_2$), and is thus often referred to as a gate oxide layer. Each of the gate portions 206, 208 preferably comprises polysilicon material, although an alternative material may be utilized to form one or both of the gate portions, as will be known by those skilled in the art.

In accordance with one aspect of the invention, the DC gate 206 preferably comprises at least two sections which are spaced laterally apart from one another. The high frequency gate 208 may comprise a first end 222 and a second end 224 opposite the first end, the first end 222 being shorter than the second end 224. In a preferred embodiment, the high frequency gate 208 may comprise a T-structure, as shown in FIG. 2A. The first end 222 of the high frequency gate 208 is formed between two or more sections of the DC gate 206 and the second end 224 of the high frequency gate is formed above at least a portion of the DC gate 206. It is to be appreciated that the invention is not limited to the precise shapes and/or locations of the portions of the gate structure relative to one another, and that alternative configurations of the gate 220 are similarly contemplated.

In accordance with an illustrative embodiment of the invention, the second end 224 of the high frequency gate 208 is formed high enough above the DC gate 206 so as to minimize coupling between the DC gate 206 and high frequency gate 208. Although there will be some coupling which may occur between the DC gate 206 and high frequency gate 208, particularly at the sides of the DC gate 206 facing the first end 222 of high frequency gate 208, this coupling will be minimal, especially if the cross-sectional thickness of the DC gate 206 is minimized. In a preferred embodiment of the invention, the overlap of the second end 224 of the high frequency gate 208 over the DC gate 206 is about 0.2 microns, although alternative amounts of overlap are contemplated, depending on the desired width of the second end of the high frequency gate.

The first end 222 of the high frequency gate 208 is configured to be relatively short in comparison to the second end 224 in order to minimize the gate-to-source capacitance associated with the device. In a preferred embodiment, the width of the first end 222 of the high frequency gate 208 is in a range from about 0.1 microns to about 0.3 microns, with an oxide gap of about 500 angstroms to about 1000 angstroms formed between the DC gate 206 and the first end 222 of the high frequency gate 208. Since the high frequency gate 208 is not primarily used to establish the channel, and thus does not have a substantial voltage applied thereto at any given time, hot-carrier degradation can be effectively reduced. The DC gate 206 can be made as wide as desired in order to minimize hot-carrier degradation effects since gate capacitance is not a concern at DC. The DC gate 206 is therefore used to bias the channel in the device while the high frequency gate 208 is primarily used to control modulation of the channel at high frequency. The combination of the two gate portions 206, 208 thus enables the MOS device of the present invention to advantageously overcome the problems of conventional MOS devices.

In order to further improve the high frequency performance of the MOS device, the gate oxide 214 beneath the first end 222 of the high frequency gate 208 is preferably formed such that it is substantially thinner than the gate oxide under the DC gate 206, in accordance with another aspect of the invention. This improves the transconductance ($g_m$) of the device, thereby benefitting the gain. Since the gate-to-source capacitance of the MOS device is inversely proportional to gate oxide thickness, reducing the thickness of the gate oxide under the gate significantly increases the gate-to-source capacitance of the device. However, as previously stated, making the gate oxide thinner undesirably reduces the breakdown voltage characteristics of the device. Rather than making the gate oxide thinner under the entire gate, as is done in conventional LDMOS devices, thereby causing a significant increase in the gate-to-source capacitance, only the portion of the gate oxide beneath the first end 222 of the high frequency gate 208 is made thinner in comparison to the gate oxide beneath the DC gate 206. Using the split gate structure of the present invention, the gate oxide under the DC gate 206 can be formed of a different thickness compared to the high frequency gate 208. In this manner, the gate-to-source capacitance associated with the high frequency gate 208 does not increase substantially, but the transconductance is improved significantly.

By way of example only, the gate oxide under the high frequency gate 208 is formed thin (e.g., by a thin gate oxide formation process) while the gate oxide of the DC gate 206 is left thicker in comparison thereto. This can be accomplished by removing the gate oxide under the high frequency gate 208 and then re-growing a thin gate oxide layer (e.g., by an oxidation process) for the high frequency gate 208. Thus, only a portion of the overall gate oxide thickness is reduced, thereby improving the transconductance of the device. In this manner, an MOS device can be fabricated which advantageously reduces the gate capacitance of the device during high frequency operation, while maintaining the DC breakdown voltage of the device. Preferably, the gate oxide thickness under the first end 222 of the high frequency gate 208 is about 150 angstroms to about 250 angstroms. By comparison, the gate oxide thickness associated with the DC gate 206 is preferably about 300 angstroms to about 400 angstroms.

Figure 2B:
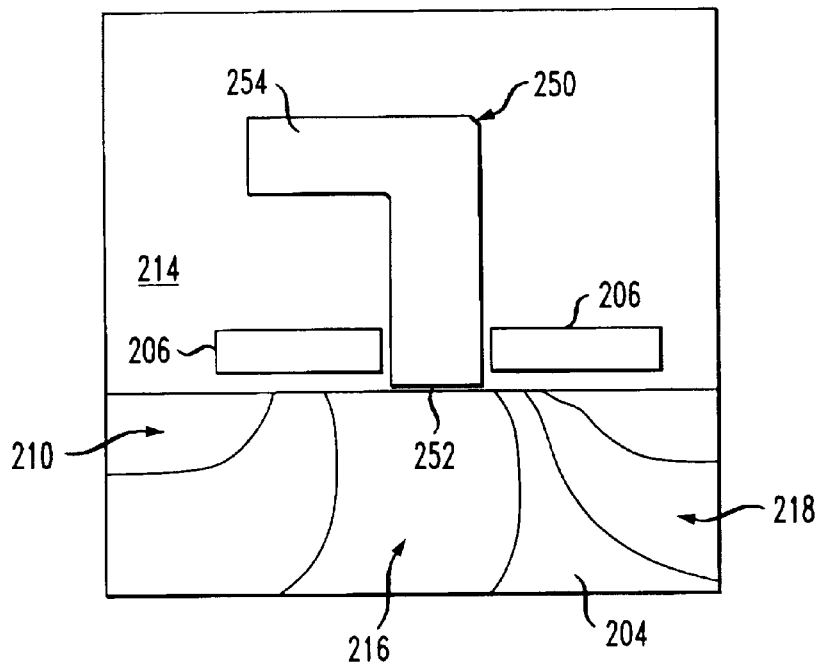
FIG. 2B is a cross-sectional view illustrating at least a portion of an alternative gate structure for use in the exemplary LDMOS device of FIG. 2A, formed in accordance with another illustrative embodiment of the present invention.

By way of example only, FIG. 2B illustrates another configuration of a high frequency gate 250 which may be used in place of the high frequency gate 208 shown in FIG. 2A, in accordance with another illustrative embodiment of the present invention. As stated above, the invention is not limited to this or any particular gate structure. The exemplary high frequency gate 250 comprises a first end 252 formed between two or more sections of the DC gate 206, and a second end 254 formed above at least a portion of the DC gate 206. The high frequency gate 250 is self-aligned to the channel region 216. In a manner consistent with the gate 220 shown in FIG. 2A, the gate oxide 214 beneath the first end 252 of the high frequency gate 250 may be formed such that it is substantially thinner than the gate oxide under the DC gate 206. The high frequency gate 250 may be shaped similar to the high frequency gate 208 depicted in FIG. 2A, except that rather than employing a T-structure, the high frequency gate 250 may be formed as an inverted L-structure. In either case, the second end 254 of the high frequency gate 250 is wider in relative comparison to the first end 252.

Figure 3:
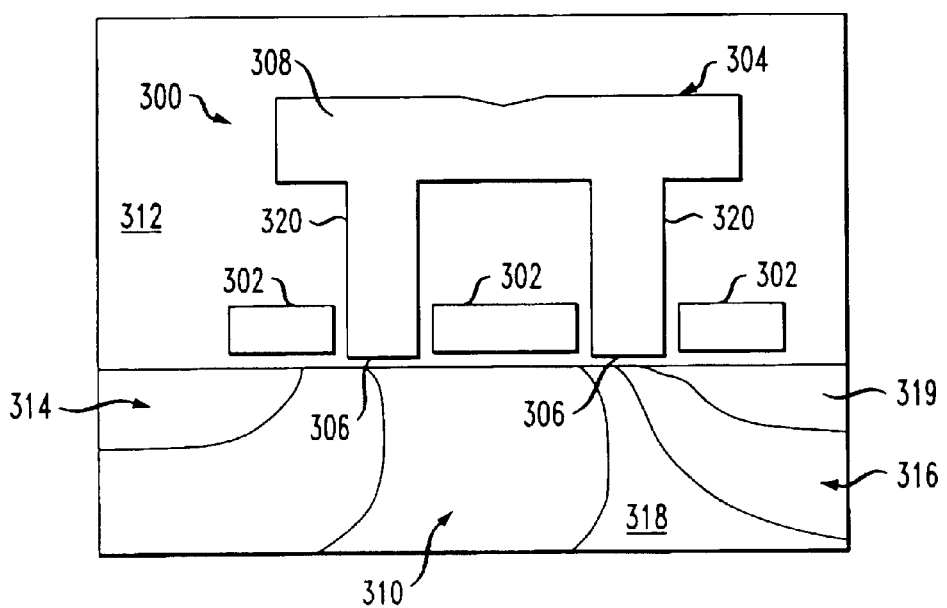
FIG. 3 is a cross-sectional view depicting at least a portion of yet another alternative gate structure, formed in accordance with another illustrative embodiment of the present invention.

As previously stated, alternative configurations of the split-gate structure are contemplated by the present invention. For example, FIG. 3 depicts an alternative gate 300, formed in accordance with yet another illustrative embodiment of the invention. Like the gate 220 shown in FIG. 2A, gate 300 is formed above at least a portion of a channel region 310 in the MOS device and proximate an upper surface of the wafer. The gate 300 is formed of a plurality of portions, namely, a DC gate 302 and a high frequency gate 304. The high frequency gate 304 is self-aligned to the channel region 310. The DC gate 302 and high frequency gate 304 are electrically isolated from one another, and from the channel region 310, a source region 314, a drain region 319, and a drift region 316, by an insulating material 312, such as, for example, silicon dioxide. The channel, source, drain and drift regions may be formed in an epitaxial layer 318 of the MOS device.

The DC gate 302 includes three sections spaced laterally apart from one another. The high frequency gate 304 includes a first end 306 and a second end 308, the first end being shorter than the second end. Unlike the illustrative T-structure embodiment shown in FIG. 2, the high frequency gate 304 may comprise a pi-structure including multiple legs 320, each leg being formed between two section of the DC gate 302. The second end 308 of the high frequency gate 304 is formed above at least a portion of the DC gate 302. As in the case of the T-structure of FIG. 2, the gate oxide under the DC gate 302 can be formed of a different thickness compared to the high frequency gate 304 so as to improve the transconductance of the device without significantly affecting other characteristics, such as, for example, hot carrier degradation or high frequency performance.

FIGS. 4A–4E depict some of the steps in an illustrative methodology which may be used in forming the exemplary LDMOS device shown in FIG. 2, in accordance with an illustrative embodiment of the present invention. The illustrative methodology will be described in the context of a conventional CMOS compatible semiconductor fabrication process technology. It is to be understood that the invention is not limited to this or any particular methodology for fabricating the device.

Figure 4A:
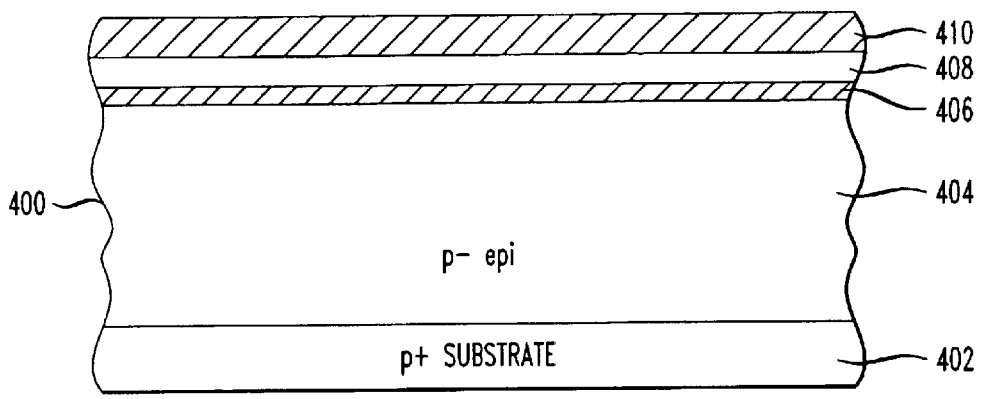
FIGS. 4A–4E are cross-sectional views depicting steps in a semiconductor fabrication process which may be used in forming the exemplary LDMOS device shown in FIG. 2A.

FIG. 4A depicts a cross section of at least a portion of an exemplary semiconductor wafer 400 in which the techniques of the present invention may be implemented. The wafer 400 includes a substrate 402, which is preferably a p+ type substrate having a high conductivity, although an n+ type substrate may alternatively be employed. As will be understood by those skilled in the art, a p+ substrate may be formed by adding a p-type impurity or dopant (e.g., Boron) of a desired concentration (e.g., about $5 \times 10^{18}$ to about $5 \times 10^{19}$ atoms) to the substrate material, such as by a diffusion or implant step, to change the conductivity of the material as desired. The epitaxial layer 404 is then grown over the entire surface of the wafer. The epitaxial layer 404 may also be modified by adding a p-type impurity. A breakdown voltage of the resulting transistor structure is determined, at least in part, by the thickness and impurity concentration of the epitaxial layer 404. Connections (e.g., via a sinker) between an upper surface of the wafer 400 and the p+ substrate 402 are preferably formed, followed by a field oxide formation (e.g., oxidation) step.

A first gate oxide layer 406 is formed on the epitaxial layer 404. The first gate oxide layer 406 may comprise an insulating material, such as, for example, silicon dioxide, that is grown or deposited on an upper surface of the wafer to a desired thickness (e.g., about 300–400 angstroms). A first polycrystalline silicon (polysilicon) layer 408 is formed over the first gate oxide layer 406, such as, for example, using a chemical vapor deposition (CVD) technique. An insulating layer 410 is then formed over the first polysilicon layer 408, such as, for example, by an oxidation step.

Figure 4B:
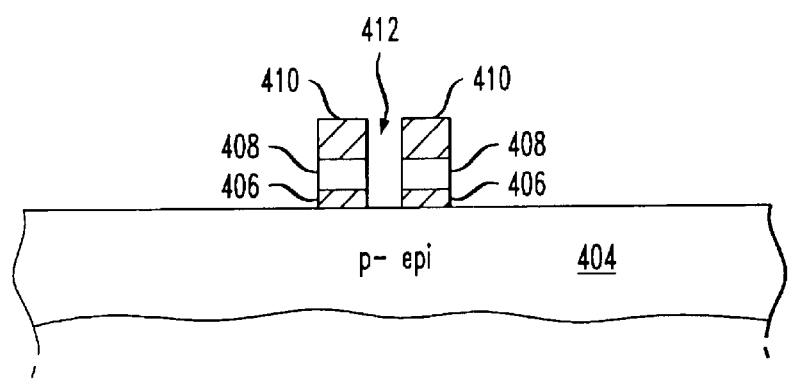

The first polysilicon layer 408 will eventually form at least a portion of the DC gate structure of the resulting device. To accomplish this, the insulating layer 410, the first polysilicon layer 408 and the first gate oxide layer 406 are preferably etched away from all areas except where the DC gate is to be located using, for example, a conventional photolithographic patterning step followed by an etching step (e.g., dry etching), as shown in FIG. 4B. An opening 412 between the two remaining sections of the DC gate will be used to form the high frequency gate portion. In the opening 412, the first gate oxide layer 406 is removed during the etching step to expose the epitaxial layer 404.

Figure 4C:
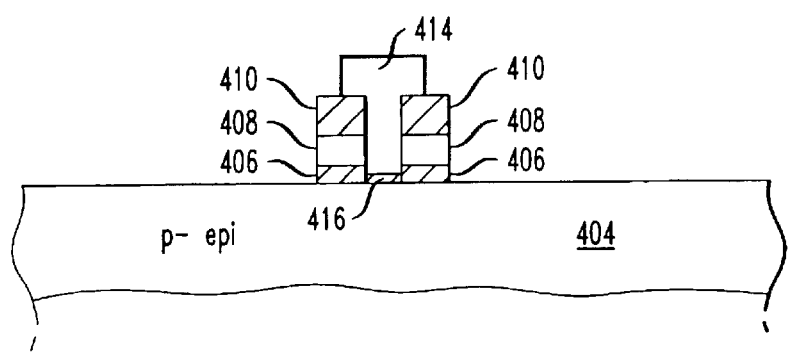

FIG. 4C depicts the formation of the high frequency gate portion. As shown in the figure, a second gate oxide layer 416 is formed in the opening between the two DC gate portions comprising first gate oxide layer 406, first polysilicon layer 408 and insulating layer 410. The second gate oxide layer 416 may be formed in a manner consistent with the formation of the first gate oxide layer, but is preferably thinner (e.g., about 150–250 angstroms) in comparison to the first gate oxide layer 406. An advantage of forming the gate oxide layers 406, 416 under the DC and high frequency gate portions, respectively, of different thicknesses has been previously discussed herein. A sidewall oxide is formed along the DC gate 408 for electrically isolating the DC and high frequency gates. A second polysilicon layer 414 is then formed on the wafer, followed by patterning and etching steps, such that the second polysilicon layer 414 overlaps at least a portion of the insulating layers 410 associated with both DC gate portions as shown, thereby forming the preferred T-structure previously described.

Figure 4D:
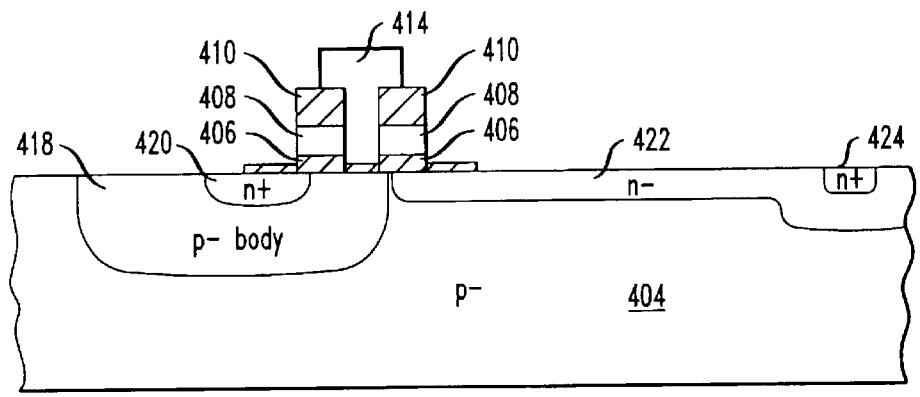

FIG. 4D illustrates the formation of the source and drain regions of the exemplary device. A p-body region 418 is formed in the epitaxial layer 404 such as, for example, by using a deep diffusion or implant step. During the diffusion step, a p-type impurity (e.g., Boron) of a predetermined concentration level is preferably used. The p-body region 418 forms at least a portion of the channel under the DC gate 408 and high frequency gate 414. A lightly doped drain (LDD) region 422 is formed in the epitaxial layer 404 such as, for example, by using a diffusion or implant step. During the formation of the LDD region 422, an n-type impurity (e.g., arsenic or phosphorous) of a predetermined concentration level is preferably employed. The LDD region 422 will form at least a portion of the drift region in the resulting device. A source region 420 is then formed in the p-body region 418 and a drain region 424 is formed in the LDD region 422. The source and drain regions 420, 424 may be formed, for example, by diffusing or implanting an n-type impurity of a known concentration level into the respective regions 418, 422 of the device. An interlayer deposition step may also be performed (e.g., oxide and/or borophosphosilicate glass (BPSG) deposition).

Figure 4E:
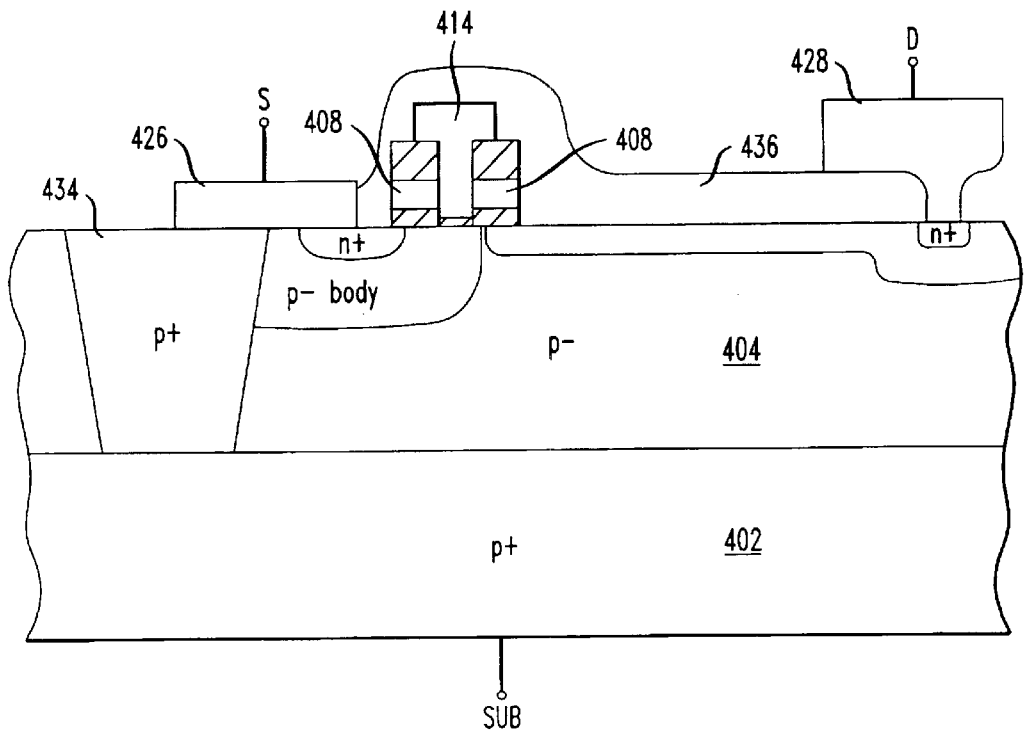

In FIG. 4E, a substantially complete MOS device is shown. Source and drain terminals 426 and 428, respectively, are formed on the upper surface of the wafer using, for example, a conventional metalization process. The source and drain terminals 426, 428 electrically contact the source and drain regions 420, 424, respectively. A sinker 434 is preferably formed in the wafer for providing a low resistance connection to the substrate 402 from the upper surface of the wafer. An insulating layer 436 (e.g., passivation layer) may then be formed over at least a portion of the upper surface of the wafer.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A metal-oxide-semiconductor (MOS) device, comprising:
   a semiconductor layer of a first conductivity type;
   a first source/drain region of a second conductivity type formed in the semiconductor layer;
   a second source/drain region of the second conductivity type formed in the semiconductor layer and spaced apart from the first source/drain region;
   a first gate formed proximate an upper surface of the semiconductor layer and at least partially between the first and second source/drain regions, the first gate comprising a plurality of sections spaced apart from one another; and
   a second gate formed proximate the upper surface of the semiconductor layer, the second gate comprising a first end formed between at least two of the plurality of sections of the first gate and a second end opposite the first end formed above at least a portion of the first gate, the second end being wider than the first end, the first and second gates being electrically isolated from one another.

2. The device of claim 1, wherein the device is configurable such that a channel is formed between the first and second source/drain regions in response to a first signal in a first frequency range applied to the first gate, the channel being at least partially modulated in response to a second signal in a second frequency range applied to the second gate.

3. The device of claim 1, wherein the first source/drain region is a source of the device and the second source/drain region is a drain of the device.

4. The device of claim 1, wherein the device comprises a diffused MOS (DMOS) device.

5. The device of claim 4, wherein the device comprises a lateral DMOS (LDMOS) device.

6. The device of claim 4, wherein the device comprises, a vertical DMOS device.

7. The device of claim 1, wherein an insulating layer is formed under the first and second gates having a first thickness under the first gate and having a second thickness under the first end of the second gate, the second thickness being smaller than the first thickness.

8. The device of claim 7, wherein the insulating layer comprises an oxide.

9. The device of claim 7, wherein the first thickness is in a range from about 300 angstroms to about 400 angstroms, and the second thickness is in a range from about 150 angstroms to about 250 angstroms.

10. The device of claim 1, wherein the second gate comprises a T-structure, at least a portion of a base of the T-structure being formed between at least two of the plurality of sections of the first gate.

11. The device of claim 1, wherein the second frequency range is substantially higher than the first frequency range.

12. The device of claim 11, wherein the first frequency range comprises substantially direct current (DC) components and the second frequency range comprises substantially radio frequency (RF) components.

13. The device of claim 1, wherein the second gate comprises an inverted L-structure, at least a portion of a base of the inverted L-structure being formed between at least two of the plurality of sections of the first gate.

14. An integrated circuit including at least one metal-oxide-semiconductor (MOS) device, the at least one MOS device comprising:
   a semiconductor layer of a first conductivity type;
   a first source/drain region of a second conductivity type formed in the semiconductor layer;
   a second source/drain region of the second conductivity type formed in the semiconductor layer and spaced apart from the first source/drain region;
   a first gate formed proximate an upper surface of the semiconductor layer and at least partially between the first and second source/drain regions, the first gate comprising a plurality of sections spaced apart from one another; and
   a second gate formed proximate the upper surface of the semiconductor layer, the second gate comprising a first end formed between at least two of the plurality of sections of the first gate and a second end opposite the first end formed above at least a portion of the first gate, the second end being wider than the first end, the first and second gates being electrically isolated from one another.

15. The integrated circuit of claim 14, wherein the device is configurable such that a channel is formed between the first and second source/drain regions in response to a first signal in a first frequency range applied to the first gate, the channel being at least partially modulated in response to a second signal in a second frequency range applied to the second gate.

16. The integrated circuit of claim 14, wherein the first source/drain region is a source of the device and the second source/drain region is a drain of the device.

17. The integrated circuit of claim 14, wherein the at least one MOS device comprises a diffused MOS (DMOS) device.

18. The integrated circuit of claim 14, wherein an insulating layer is formed under the first and second gates having a first thickness under the first gate and having a second thickness under the first end of the second gate, the second thickness being smaller than the first thickness.

19. The integrated circuit of claim 14, wherein the second gate comprises a T-structure, at least a portion of a base of the T-structure being formed between at least two of the plurality of sections of the first gate.

20. The integrated circuit of claim 14, wherein the second frequency range is substantially higher than the first frequency range.

21. A method of forming a metal-oxide-semiconductor (MOS) device, comprising the steps of:
   forming a first gate including a plurality of first gate structures proximate an upper surface of a semiconductor layer, the plurality of first gate structures being spaced apart from one another;
   forming at least a second gate proximate the upper surface of the semiconductor layer, the second gate comprising a first end formed between at least two of the plurality of first gate structures and a second end opposite the first end formed at least above a portion of the first gate, the second gate being configured such that the second end is wider than the first end, the first gate and the second gate being electrically isolated from one another;
   forming first and second source/drain regions in the semiconductor layer proximate the first and second gates.

22. The method of claim 21, wherein the MOS device is configurable such that a channel is formed between the first and second source/drain regions in response to a first signal in a first frequency range applied to the first gate structure, the channel being at least partially modulated in response to a second signal in a second frequency range applied to the second gate structure.

* * * * *